United States Patent
Lin et al.

(10) Patent No.: US 8,462,510 B2
(45) Date of Patent: Jun. 11, 2013

(54) BOARD-LEVEL PACKAGE WITH TUNED MASS DAMPING STRUCTURE

(75) Inventors: Wen-Yi Lin, New Taipei (TW); Po-Yao Lin, Zhudong Township, Hsinchu County (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 226 days.

(21) Appl. No.: 13/105,577

(22) Filed: May 11, 2011

(65) Prior Publication Data
US 2012/0287579 A1    Nov. 15, 2012

(51) Int. Cl.
*H05K 7/00* (2006.01)
*H05K 7/20* (2006.01)
*H01L 21/66* (2006.01)
*H01L 21/58* (2006.01)
*H01R 9/00* (2006.01)
*F16F 7/10* (2006.01)

(52) U.S. Cl.
USPC ........... 361/720; 361/719; 361/748; 361/767; 361/771; 361/772; 188/207; 188/208; 188/209; 188/380; 188/378; 257/676; 257/678; 257/680; 257/719; 174/16.3; 174/252; 29/830; 29/832; 29/854

(58) Field of Classification Search
USPC ....... 361/679.46–679.54, 704–712, 715–724, 361/732–752, 762–777; 188/207–209, 377–380; 257/676–680, 706–727, 783, 684, 257/796; 174/16.3, 252, 520, 254–267; 29/825–854; 165/80.2, 80.3, 104.33, 121–126, 165/185
See application file for complete search history.

(56) References Cited

U.S. PATENT DOCUMENTS

| | | | | |
|---|---|---|---|---|
| 3,102,722 A | * | 9/1963 | Hamontre | 267/165 |
| 3,833,836 A | * | 9/1974 | Moksu et al. | 361/721 |
| 4,053,943 A | * | 10/1977 | Galvin | 361/757 |
| 4,382,587 A | * | 5/1983 | Heinrich et al. | 267/160 |
| 4,768,286 A | * | 9/1988 | Ketcham | 29/841 |
| 5,552,209 A | * | 9/1996 | McCutcheon | 428/209 |
| 5,914,864 A | * | 6/1999 | MacDonald et al. | 361/752 |
| 5,958,556 A | * | 9/1999 | McCutcheon | 428/172 |
| 6,233,816 B1 | * | 5/2001 | Franke et al. | 29/829 |
| 6,375,475 B1 | * | 4/2002 | Brodsky | 439/66 |
| 6,429,510 B1 | * | 8/2002 | Moller | 257/690 |
| 6,557,675 B2 | * | 5/2003 | Iannuzzelli | 188/380 |
| 6,774,490 B2 | * | 8/2004 | Soga et al. | 257/772 |
| 6,920,052 B2 | * | 7/2005 | Callahan et al. | 361/767 |
| 7,185,423 B2 | * | 3/2007 | Augustin et al. | 29/832 |
| 7,296,654 B1 | * | 11/2007 | Berman | 181/207 |
| 7,461,728 B2 | * | 12/2008 | Huston et al. | 188/378 |
| 7,477,527 B2 | * | 1/2009 | Suhir | 361/807 |
| 7,518,235 B2 | * | 4/2009 | Coico et al. | 257/719 |
| 7,821,117 B2 | * | 10/2010 | Brown et al. | 257/678 |

FOREIGN PATENT DOCUMENTS

| | | | | |
|---|---|---|---|---|
| JP | 06260570 A | * | 9/1994 | |
| JP | 407183635 A | * | 7/1995 | |

* cited by examiner

*Primary Examiner* — Michail V Datskovskiy
(74) *Attorney, Agent, or Firm* — Haynes and Boone, LLP

(57) ABSTRACT

A board-level package includes a printed circuit board, a semiconductor die package mounted on the printed circuit board, a tuned mass structure, and a support structure mounted to the printed circuit board and supporting the tuned mass structure.

20 Claims, 8 Drawing Sheets

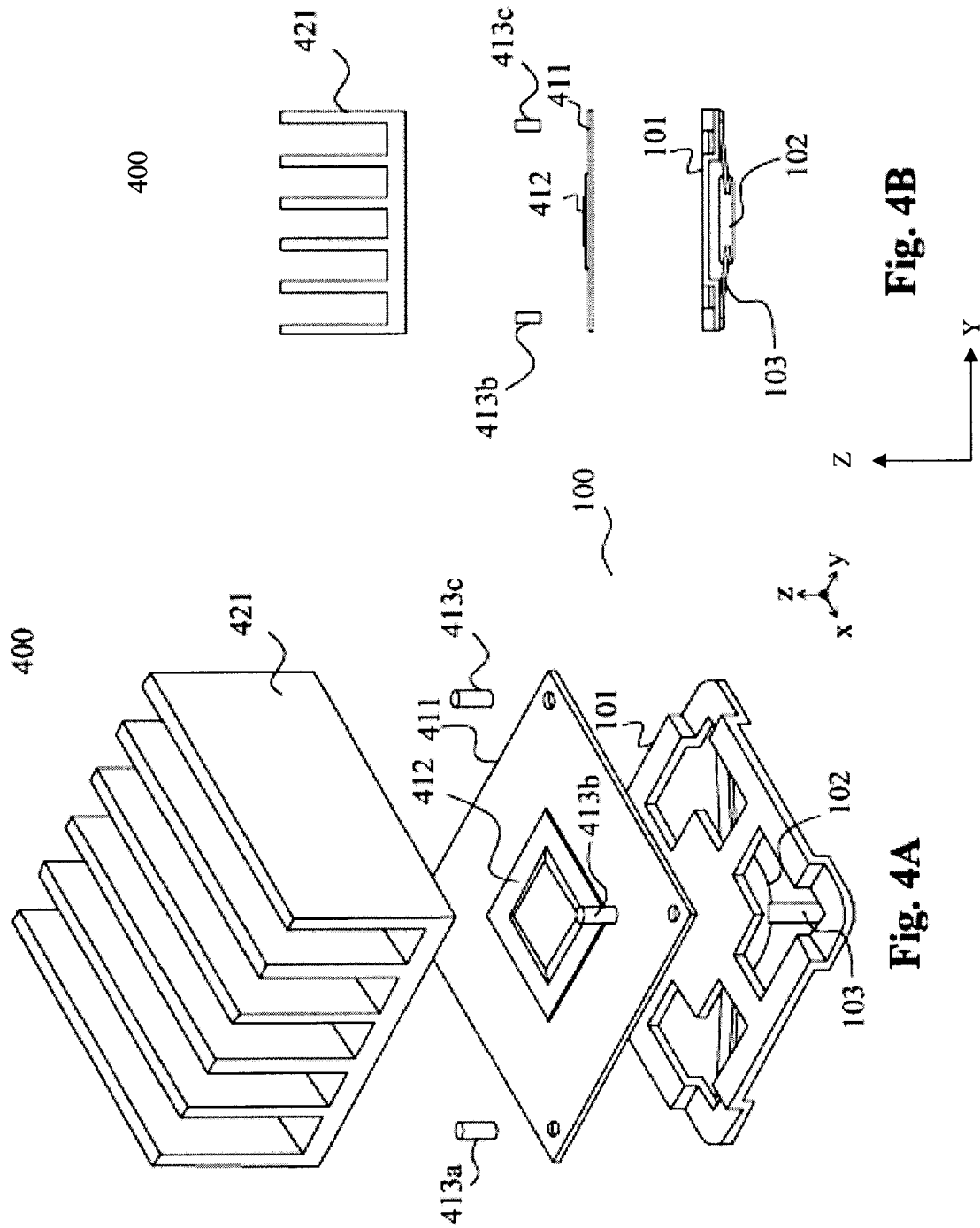

BOARD-LEVEL PACKAGE WITH TUNED MASS DAMPING STRUCTURE

TECHNICAL FIELD

The present disclosure relates generally to board-level packages and, more specifically, to board-level packages including a tuned-mass damping structure.

BACKGROUND

Integrated circuit (IC) technologies are constantly being improved. Such improvements frequently involve scaling down device geometries to achieve lower fabrication costs, higher device integration density, higher speeds, and better performance. Similarly, semiconductor packages are becoming smaller and including more advanced devices, exemplified by the use of chip-scale packages (CSPs).

A conventional use for semiconductor packages is to mount a package on a printed circuit board using a Ball Grid Array (BGA) technique. In this approach, the semiconductor package is mounted to the printed circuit board using solder balls that bond to metal contact pads on the printed circuit board. The metal contact pads provide power and data communications for the chip in the package. The printed circuit board may have other features as well, such as a power supply, a heat sink, a fan, and the like.

One particular failure mode of board-level packages is solder joint failure, where the electrical connections to the chip are damaged because the solder fails to make proper contact with the contact pads on the printed circuit board or on the chip. A cause for some solder joint failures is printed circuit board bending due to mechanical shock. The mechanical shock may be caused by shipping or field use of a product that includes the board-level package. Another cause of mechanical shock includes JEDEC testing that subjects the board-level package to a drop test. Such JEDEC testing is described, e.g., in JEDEC Standard No. 22-B111.

The mechanical shock can cause bending of the printed circuit board. If the printed circuit board is considered to lie in the x-y plane, the bending includes deviation from the x-y plane by the edges relative to the center, often in an under-damped, oscillatory motion. The oscillatory bending can cause damage to the electrical contacts where the solder balls touch the contact pads. Current solutions to minimize damage due to bending include use of larger contact pads for the solder balls, use of thinner chip packages, and use of metal supports. However, such conventional solutions may not provide adequate damage prevention in many scenarios. Therefore, there is a need for a better technique to prevent damage from mechanical shock, especially during JEDEC testing.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

FIGS. 4A and B are illustrations of a board-level package, with a damping structure, according to one embodiment.

SUMMARY

Figure 1:
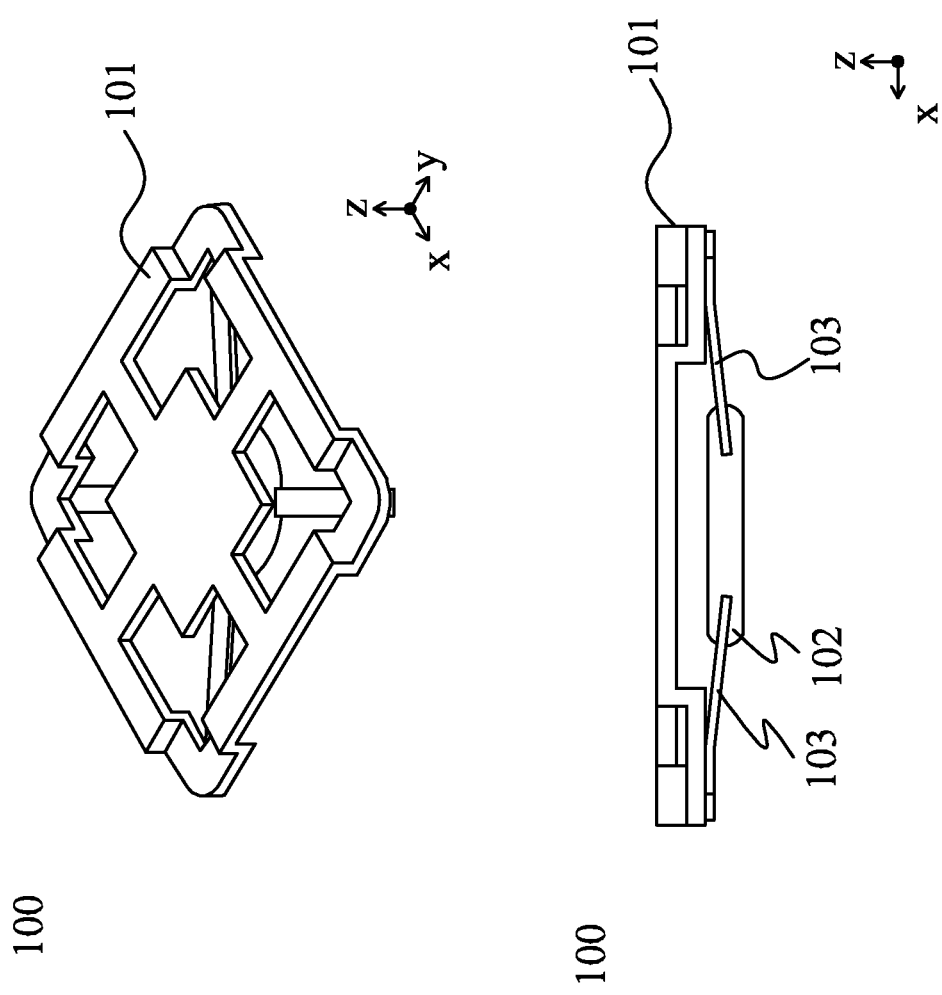
FIG. 1 provides two views of an exemplary active damping structure according to one embodiment.

One of the broader forms of the present disclosure involves a board-level package includes a printed circuit board, a semiconductor die package mounted on the printed circuit board, a tuned mass structure, and a support structure mounted to the printed circuit board and supporting the tuned mass structure.

Another one of the broader forms of the present disclosure involves a package includes a circuit board with one or more electrical components mounted thereon, a support structure coupled to the circuit board with a footprint corresponding to a footprint of the circuit board, and a damper supported by the support structure and suspended in a position corresponding to a center of the support structure.

Still another one of the broader forms of the present disclosure involves a process for manufacturing a board-level package includes mounting a semiconductor die package to a circuit board and mounting a mechanical oscillation damping structure to the circuit board. The mechanical oscillation damping structure includes an active mass damper suspended relative to the circuit board so that mechanical oscillation of the active mass damper reduces a flexing oscillation of the circuit board.

DETAILED DESCRIPTION

It is understood that the following disclosure provides many different embodiments, or examples, for implementing different features of various embodiments. Specific examples of components and arrangements are described below to simplify the present disclosure. These are, of course, merely examples and are not intended to be limiting. For example, the mounting of a first feature over or on a second feature in the description that follows may include embodiments in which the first and second features are coupled in direct contact, and may also include embodiments in which additional features may be included between the first and second features, such that the first and second features may not be in direct contact.

Moreover, the terms "top," "bottom," "under," "over," and the like are used for convenience and are not meant to limit the scope of embodiments to any particular orientation. In addition, the present disclosure may repeat reference numerals and/or letters in the various examples. This repetition is for the purpose of simplicity and clarity and does not in itself dictate a relationship between the various embodiments and/or configurations discussed.

Various embodiments include board-level packages that have a semiconductor die mounted on a first side of a printed circuit board. The printed circuit board also includes a support structure mounted on a second side of the printed circuit board. The support structure mechanically supports a tuned mass damping structure that is designed to have an oscillation that counteracts a bending oscillation of the printed circuit board. The tuned mass damping structure may also be referred to as an "active damping structure."

In one example embodiment, the printed circuit board has a chip package mounted thereon using ball grid technology. A heat sink is then disposed on the printed circuit board so as to be on top of the chip package. The purpose of the heat sink is to dissipate heat from the integrated circuit in the chip package, and in this example, the heat sink is made of a metal, such as aluminum. However, a heavy heat sink may induce excessive warping of the printed circuit board during transportation, field use, and/or mechanical shock testing. Examples of printed circuit boards with a chip package and a heat sink include a motherboard for a laptop or desktop computer, a processor board for a hand-held device, and the like though the scope of embodiments is not so limited.

Further in this example, the board-level package has a support structure that includes a frame that conforms to the boundaries of the printed circuit board. In other words, in this example, the x- and y-extent of the frame approximately corresponds to the x- and y-extent of the printed circuit board. The support structure in this example is mounted to a side of the printed circuit board opposite that of the chip package and heat sink.

A tuned mass is suspended from the support structure. In one example, the tuned mass is suspended by metal ribbons that attach to the outside edges of the frame of the support structure. The tuned mass may include an object of any suitable shape, weight, or size. In this example, the tuned mass includes a metal weight that has a mass approximately tuned to be in the range of between one-fourth and one-half of that of the heat sink.

During mechanical shock, the printed circuit board experiences oscillatory bending. The tuned mass has an oscillation that counteracts the oscillation of the printed circuit board. As a result the printed circuit board experiences fewer bending oscillations, and the oscillations have a smaller amplitude, than would be experienced by the printed circuit board absent the tuned mass.

Another example embodiment includes a method to manufacture a board-level package. In this example, a chip package is mounted to the printed circuit board using ball grid technology. A heat sink is mounted on the printed circuit board over the chip package. On the other side of the printed circuit board a support structure is mounted. A tuned mass is suspended from the support structure.

The example further includes mechanical shock testing. The mechanical shock testing may include testing according to JEDEC Standard No. 22-B111, though the scope of embodiments is not so limited. Embodiments may include mechanical shock testing according to other standards or proprietary techniques. JEDEC testing includes applying a specified amount of G-forces per millisecond in a half sine pulse to the circuit board by dropping the circuit board.

The mechanical shock testing induces oscillations in the printed circuit board and in the tuned mass structure. The oscillations in the tuned mass structure reduce the severity of the oscillations in the printed circuit board, thereby reducing the chance of damage to the electrical connections on the surface of the printed circuit board.

The process may include further steps, such as installation in a finished product (e.g., a laptop computer, etc.), transportation to the customer, and the like. The embodiments described are exemplary and are not intended to be limiting. Various embodiments may be different from the embodiments described above. For instance, some embodiments may include more than one tuned mass structure in a board-level package.

Other embodiments may include a tuned mass structure on a same side of the printed circuit board as the heat sink. Furthermore, some embodiments do not include a heat sink or chip package or may use a mounting technology other than ball grid technology. More embodiments are described in greater detail below.

FIG. 1 is an illustration of exemplary damping structure 100, adapted according to one embodiment and shown in two perspective views for ease of illustration. Damping structure 100 is shown at the top of FIG. 1 in a perspective view and at the bottom of FIG. 1 in a side-on view on the x-y plane. It should be noted that the x-, y-, and z-directions are used for example only, and the use of such dimensional illustration does not limit the scope of embodiments to any particular orientation.

Damping structure 100 in this embodiment includes two main portions—support structure 101 and tuned mass block 102. Support structure 101 is a frame that attaches to the printed circuit board (not shown) and provides mechanical support for the tuned mass block 102. Support structure 101 may be constructed of any of a variety of materials, including, e.g., aluminum, other light metals, plastics, and combinations thereof.

Tuned mass block 102 can also be made of any of a variety of materials. Examples of suitable materials include, but are not limited to, aluminum, copper, other metals, plastics, and combinations thereof. Tuned mass block 102 is suspended from support structure 101 using ribbons 103, which in this example may be made of any of a variety of materials, such as aluminum or copper.

Tuned mass block 102 is shown as a thin, circular disk, though the scope of embodiments is not so limited. Tuned mass block 102 can be manufactured to be any particular shape, though thin shapes may be more desirable in some applications in order to minimize a vertical dimension of the board-level package. Examples of other suitable shapes includes toroids, rectangular shapes, spherical shapes, and the like. Furthermore, alternative embodiments may suspend tuned mass block 102 from support structure 101 using mechanism other than ribbons 103. For example, another embodiment may use one or more springs to suspend tuned mass block 102 from a center of support structure 101.

Figure 2A:
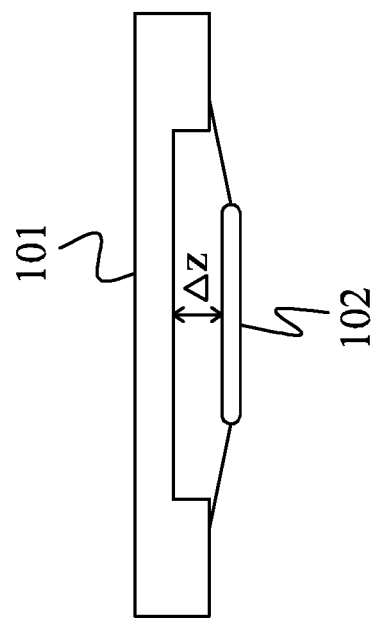
FIGS. 2A and B are illustrations of the active damping structure during oscillatory motion.
Figure 2B:
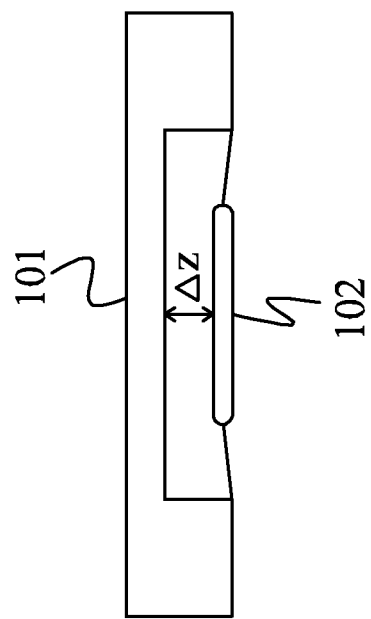

Tuned mass block 102 is configured to oscillate when subjected to mechanical shock. In this example, the mechanical shock occurs in the z-direction, and the oscillation of tuned mass block 102 is in the z-direction as well. FIGS. 2A and B provide an illustration of oscillation of tuned mass block 102 according to one embodiment. In FIG. 2A one position of tuned mass block 102 in an example oscillation is shown, where tuned mass block 102 is farthest from support structure 101. Z-axis displacement is represented by delta z, and delta z is relatively large in FIG. 2A. FIG. 2B illustrates another position in the example oscillation, where delta z is smaller than in FIG. 2A, and mass structure 102 is closest to support structure 101. Immediately following the mechanical shock, the amplitude of the oscillation is greatest, and tuned mass block 102 moves up and down in the z-axis (toward and away from the x-y plane of the support structure 101). As time passes, the amplitude of oscillation decreases.

Damping structure 100, itself, is an under-damped structure. For instance, after mechanical shock, tuned mass block 102 oscillates several times until the amplitude of oscillation decreases to zero. In another aspect, though, damping structure 101 provides a damping effect to a board-level package, causing oscillations of a circuit board to decrease to zero faster than the oscillations would otherwise decrease.

Figure 3B:
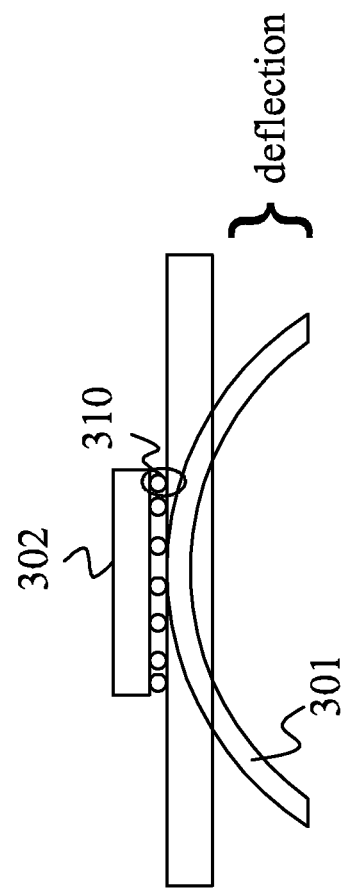
FIGS. 3A and B are illustrations of a printed circuit board at rest and during flexural oscillation.
Figure 3A:
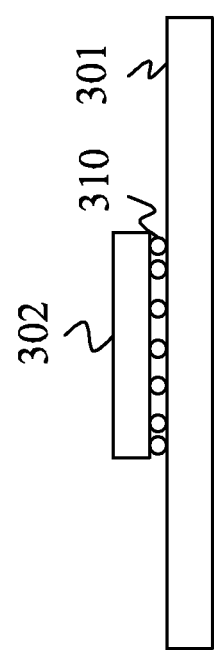

FIG. 3A is a side-view illustration of exemplary printed circuit board 301 and chip package 302. Chip package 302 is mounted to printed circuit board 301 using ball grid technology. Though not shown in FIG. 3A, each of the solder balls (exemplified by solder ball 310) is bonded to a contact pad on printed circuit board 301 and to a contact pad on chip package 302. FIG. 3A shows printed circuit board 301 in its at-rest state without flexing oscillations.

FIG. 3B shows a snapshot of oscillation of printed circuit board 301. Note the deflection between the oscillating state and the at-rest state of printed circuit board 301. Such deflection may induce cracks where the solder balls bond to the contact pads on chip package 302 and printed circuit board 301. Some embodiments described herein decrease the deflection, thereby also decreasing the chance of circuit board failure due to solder cracks.

Such oscillatory flexure may be caused by drop testing, dropping during transport, accidents during field use, and the like. In one example, JEDEC drop testing applies a 1500 G/0.5 ms half sine pulse to a board-level package under test. The mechanical impact can be applied by a drop testing machine that has a drop table and a strike surface on a rigid base. A package under test is placed on top of the drop table, and the drop table is lifted to a specified height, held in alignment by guide rails. Gravity is used to accelerate the drop table toward the strike surface. The impact of the drop table striking the strike surface causes the half-sine pulse and induces flexure in the board-level package.

JEDEC drop testing can provide good information about whether a board-level package, or lot of packages, is suitable for use by downstream customers. Too many failures may indicate a weak design or poor workmanship by an assembly facility. On the other hand, a relatively few number of failures may indicate a good design and/or high quality workmanship. In any event, the JEDEC drop test applies a severe mechanical shock to a board-level package, and various embodiments of the present disclosure operate to ameliorate the effects of the mechanical shock, whether by drop testing or other cause.

FIGS. 4A and B are exploded views of board-level package 400 according to one embodiment. FIG. 4A shows an exploded perspective view, and FIG. 4B shows an exploded side view.

Board-level package 400 includes damping structure 100, which is described above in more detail with respect to FIG. 1. Board-level package 400 also includes printed circuit board 411 with chip package 412 mounted thereon. Printed circuit board 411 may include any type of printed circuit board, such as a Metal Core Printed Circuit Board (MCPCB), a ceramic circuit board, a FR4 circuit board, and the like. Chip package 412 may be mounted to printed circuit board 411 using any available mounting technique, including, e.g., ball grid technology as shown in FIGS. 3A, B.

Damping structure 101 may be coupled with printed circuit board 411 using any technique now known or later developed. In one example, an adhesive glue is used for mounting support structure 101 to printed circuit board 411, though other embodiments may employ screws 413 or other technique for mounting.

Support structure 101 and printed circuit board 411 occupy parallel planes, and tuned mass block 102 has a freedom of movement toward and away from the centers of the support structure 101 and the printed circuit board 411. In this example, the footprint of damping structure 100 is approximately the same as the footprint of printed circuit board 411. In other words, printed circuit board 411 and damping structure 100 have a same or similar area in the x-y plane, and damping structure 100 is mounted to the periphery of printed circuit board 411. Such configuration allows damping structure 100 to have an adequate amount of x-y displacement between tuned mass block 102 and support structure 101, thereby facilitating the suspension of tuned mass block for adequate z-axis displacement during oscillation of tuned mass block 102. However, other embodiments may configure damping structure 100 to have a different footprint than that of printed circuit board 411.

Heat sink 421 is mounted to printed circuit board 411 using screws 413. FIG. 4A shows three screws 413, but it is understood that board-level package 400 includes four screws in this embodiment. It is also understood that other embodiments may include more or fewer screws, as desired or may omit screws altogether in favor of using another technique for mounting heat sink 421 to printed circuit board 411. Other techniques may include, but are not limited to, adhesive glue.

Heat sink 421 makes thermal contact with chip package 412, and heat from chip package 412 spreads into heat sink 421 during normal operation. While not shown in this embodiment, other embodiments may include a fan device coupled to heat sink 421. In such an arrangement, a fan would draw air over the surface area of heat sink 421 and dissipate heat into the ambient atmosphere. Heat sink 421 operates to dissipate the heat from chip package 412 with or without a fan, though use of a fan may improve the heat dissipation. In some embodiments, heat sink 421 is made of aluminum, but the scope of embodiments may include any other heat-conductive material appropriate for a particular application.

During drop testing, board-level package 400 is placed on a drop table, as described above. The drop testing applies the mechanical shock, thereby inducing oscillatory flexing in printed circuit board 411 (e.g., as illustrated in FIG. 3B). However, damping structure 100 produces a reverse oscillation, which damps the oscillation of the printed circuit board. As a result, printed circuit board 411 experiences fewer oscillations, and smaller amplitude oscillations, from the drop impact than it would have experienced without the damping effect.

Tuned mass block 102 may be designed to have any mass appropriate for a given application. In one example, tuned mass block has a mass of one-fourth to one-half (e.g., one-third) that of heat sink 421. Such mass may provide acceptable damping without adding unacceptable weight to package 400 as a whole.

Figure 5:
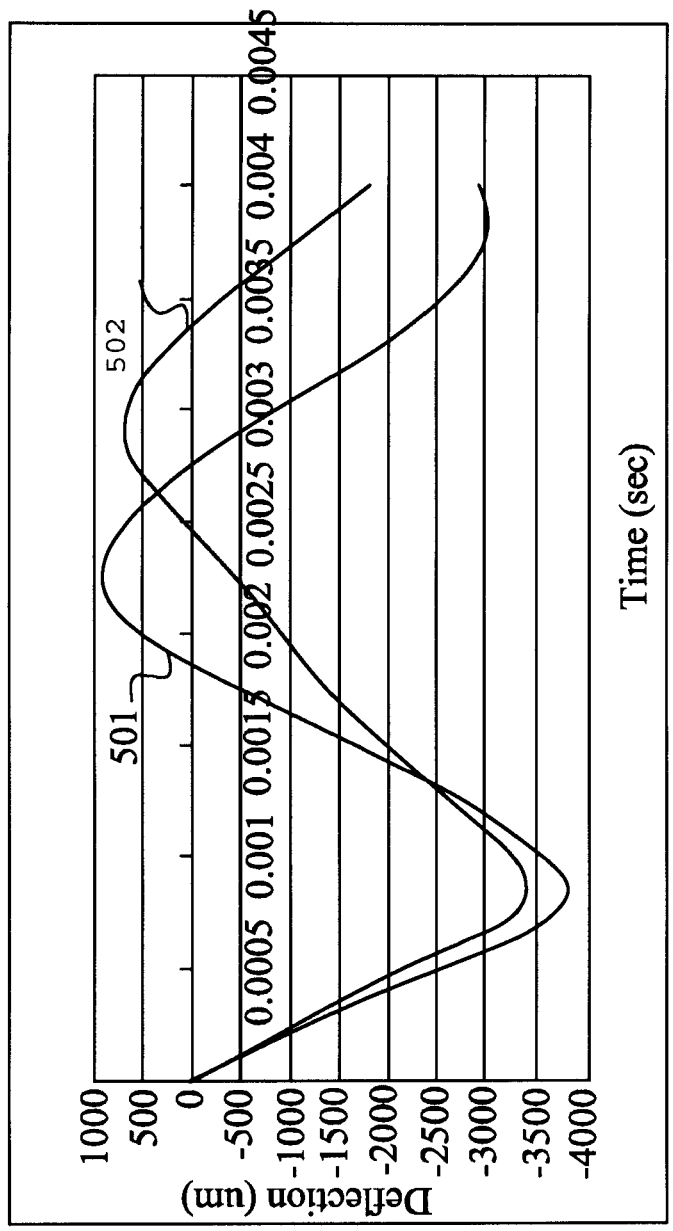
FIG. 5 is a graph of a computer simulation showing a difference in oscillatory behavior due to use of an active damping structure according to one embodiment.

FIG. 5 is a graph showing an example simulation of printed circuit board oscillation of board-level package 400. The y-axis is deflection in micrometers, and the x-axis is time in seconds. Curve 501 shows simulated oscillations for a board-level package similar to package 400 but without damping structure 100. By contrast, curve 502 shows simulated oscillation with the damping effect provided by damping structure 100.

Curve 502 shows decreased amplitude and increased period for the oscillations in the printed circuit board compared to curve 501. FIG. 5 shows that use of a damping structure offers significant benefit in reducing the severity of oscillations. Reduction in severity of oscillations may translate to higher yield for some packaging processes in some embodiments.

Embodiments are not limited to the particular configuration shown in FIGS. 4A and B. In fact, other embodiments may employ damping configurations that are different from the embodiments shown above. In one example, a board-level package may include more than one damping structure. In another example, a board-level package may include a damping structure on top of a heat sink additionally, or alternatively, to a damping structure on a surface of a printed circuit board opposite the heat sink.

Figure 6:
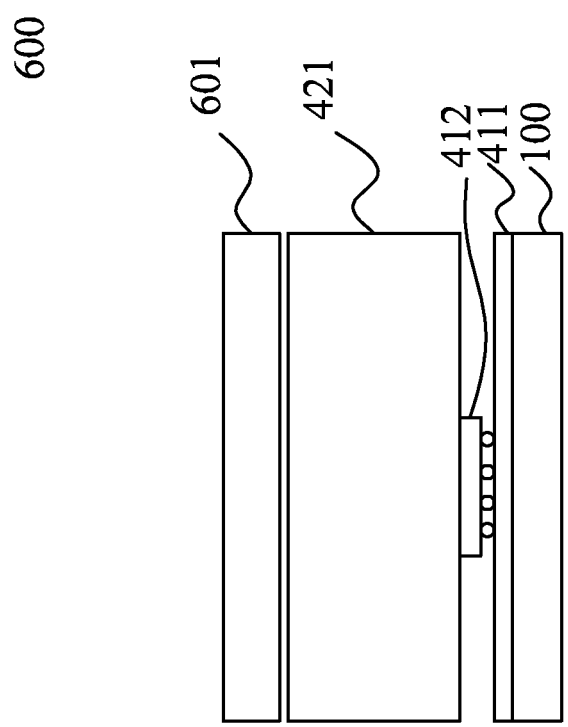
FIGS. 6 and 7 are illustrations of different configurations for placement and number of active damping structures.

FIG. 6 is an illustration of exemplary board-level structure 600 adapted according to one embodiment. Board-level structure 600 includes damping structure 100, on a side opposite heat sink 421, printed circuit board 411, chip package 412, and heat sink 421. Board-level structure 600 also includes damping structure 601 mounted on heat sink 421. An additional damping structure, such as shown in FIG. 6, may provide further damping, but at the cost of increased weight and size of the board-level package 600. In a similar embodiment, damping structure 601 is mounted on damping structure 100 rather than on heat sink 421. The scope of embodiments provides for any given arrangement of damping structures in a board-level package.

Figure 7:
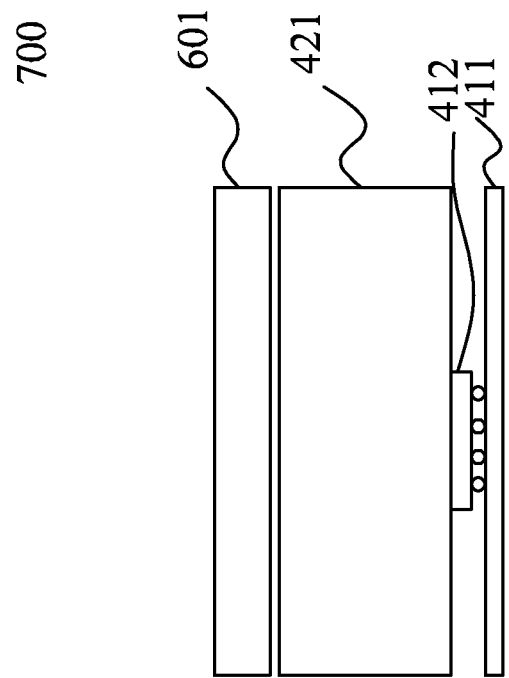

FIG. 7 is an illustration of exemplary board-level package 700 adapted according to one embodiment. Board-level package 700 is similar to board-level package 600 (FIG. 6), but omits damping structure 100. The embodiment of FIG. 7 may provide some damping, but may be somewhat less effective than the embodiment of FIG. 4, which couples damping structure 100 directly to printed circuit board 411.

Figure 8:
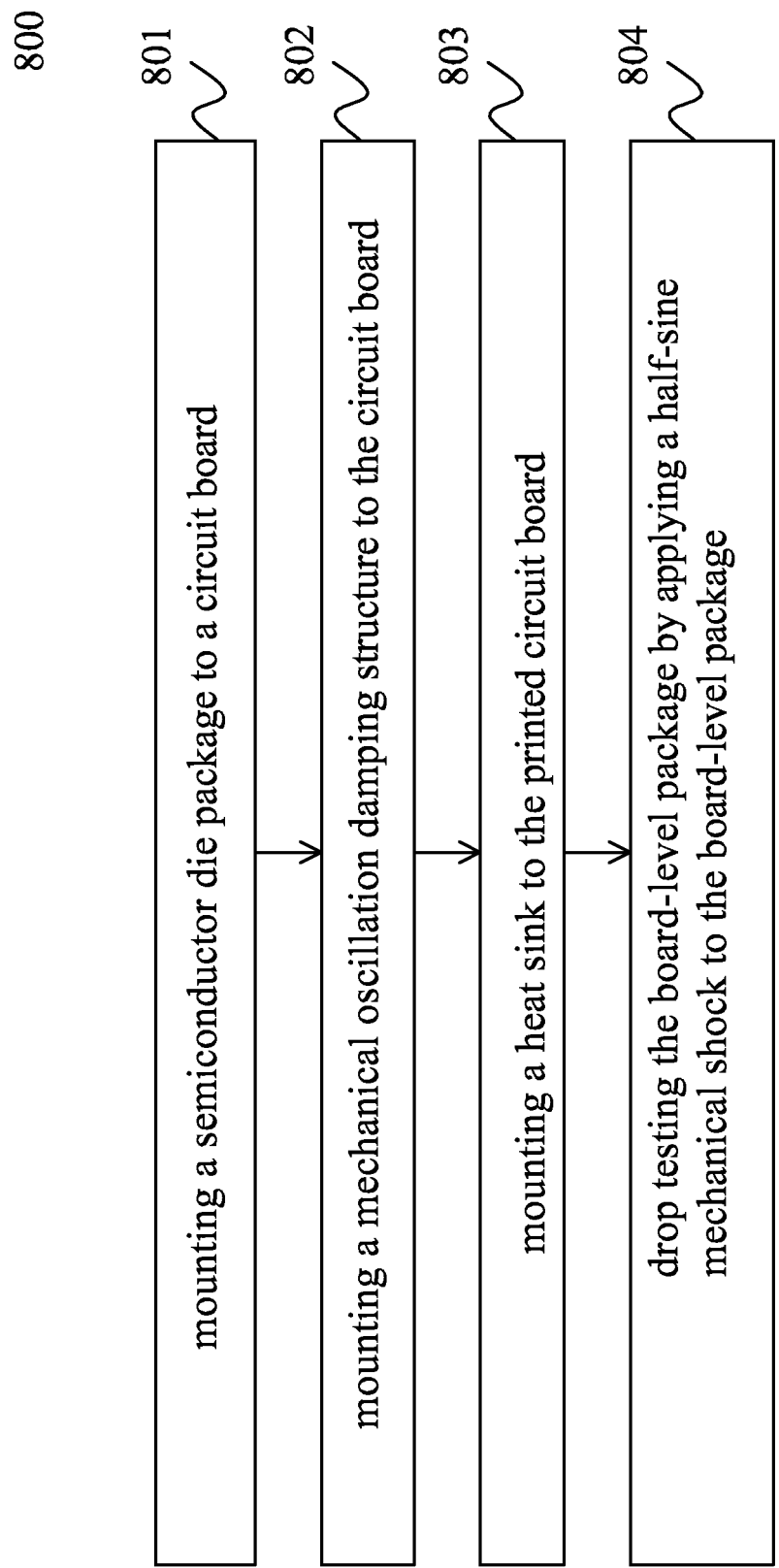
FIG. 8 is an illustration of a process for manufacturing and testing a board-level package according to one embodiment.

Some embodiments include processes to manufacture and/or test board-level packages. FIG. 8 is an illustration of exemplary method 800 adapted according to one embodiment for manufacturing and testing a board-level package, such as package 400 (FIGS. 4A, B).

In block 801, a semiconductor die package is mounted to a circuit board. An example is shown above where ball grid array technology is used. However, the scope of embodiments includes other techniques to couple a semiconductor device to a circuit board, such as pin grid technology and the like.

In block 802, a mechanical oscillation damping structure is mounted to the circuit board. In this example, the mechanical oscillation damping structure is configured to counteract flexing oscillation in the circuit board due to mechanical shock. The damping structure includes an active mass damper, such as shown and described in FIGS. 4A and B, where the damping structure includes a mass that oscillates, thereby applying a counteracting force to the flexing circuit board during times of mechanical shock. Block 802 is not limited to mounting a single damping structure, as block 802 may include mounting multiple damping structures, as shown in FIG. 6.

In block 803, a heat sink is mounted to the printed circuit board. An example heat sink is shown in FIGS. 4A and B. Mounting the heat sink may include use of screws, adhesive glue, or other techniques to couple the heat sink within the board-level assembly.

In block 804, the board-level package is drop tested. An example drop test is described above according to JEDEC Standard No. 22-B111, though embodiments may include any other appropriate drop test. During the drop test, the mechanical oscillation damping structure provides damping to flexible oscillations in the circuit board, thereby lessening the severity of the mechanical shock.

In some embodiments, block 804 includes testing the electrical connections on the board, including the connections between the chip package and the board. Block 804 may further including identifying the board as having passed or failed the drop test based in the integrity of the electrical connections.

The scope of embodiments includes processes that add, omit, modify, and/or rearrange actions compared with method 800. For instance, other embodiments may mount the heat sink before mounting the damping structure. Other embodiments may further include shipping the board-level package to a customer and/or assembling the board-level package into a finished product. Moreover, embodiments may additionally include more conventional techniques to reduce solder cracks, such as using thinner chip packages and/or larger contact pads.

Various embodiments may include one or more advantages over conventional techniques. For instance, various embodiments may provide more robust protection against solder joint failure by reducing tensile stress at the solder joints. In turn, reducing solder joint failure may improve yield and product reliability.

The foregoing has outlined features of several embodiments so that those skilled in the art may better understand the detailed description that follows. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions and alterations herein without departing from the spirit and scope of the present disclosure.

What is claimed is:

1. A board-level package comprising:
a printed circuit board;
a semiconductor die package mounted on the printed circuit board;
a tuned mass structure; and
a support structure mounted to the printed circuit board and supporting the tuned mass structure.

2. The board-level package of claim 1 in which the semiconductor die package is coupled to the printed circuit board using a plurality of solder balls.

3. The board-level package structure of claim 1 in which the support structure has a shape that matches a shape of the printed circuit board and is coupled to a perimeter of the printed circuit board.

4. The board-level package of claim 1 in which the tuned mass structure is suspended by the support structure and has a freedom of movement to mechanically oscillate in a direction perpendicular to a plane of the printed circuit board.

5. The board-level package of claim 1 in which the tuned mass structure comprises a metal weight suspended from four corners of the support structure.

6. The board-level package of claim 5 in which the metal weight is suspended from the support structure using a plurality of metal ribbons.

7. The board-level package of claim 1 in which the support structure and the printed circuit board occupy parallel planes, and in which the tuned mass structure has a freedom of movement toward and away from centers of the support structure and printed circuit board.

8. The board-level package of claim 1 further comprising a heat sink coupled to a side of the printed circuit board opposite the support structure.

9. The board-level package of claim 1 further comprising a heat sink coupled to a same side of the printed circuit board as the support structure.

10. A package comprising:
a circuit board with one or more electrical components mounted thereon;
a support structure coupled to the circuit board with a footprint corresponding to a footprint of the circuit board; and
a damper supported by the support structure and suspended in a position corresponding to a center of the support structure.

11. The package of claim 10 in which the support structure comprises a metal frame with a perimeter corresponding to a perimeter of the circuit board.

12. The package of claim 10 further comprising a chip package mounted on the circuit board using a ball grid array.

13. The package of claim 10 further comprising a heat sink mounted on the circuit board to be in thermal contact with a chip package mounted on the circuit board.

14. The package of claim 10 in which the support structure includes a plurality of metal ribbons suspending the damper.

15. The package of claim 10 in which the damper comprises one or more of: copper and aluminum.

16. A process for manufacturing a board-level package, the process comprising:
   mounting a semiconductor die package to a circuit board; and
   mounting a mechanical oscillation damping structure to the circuit board, the mechanical oscillation damping structure including an active mass damper suspended relative to the circuit board so that mechanical oscillation of the active mass damper reduces a flexing oscillation of the circuit board.

17. The process of claim 16 further comprising:
   mounting a heat sink to the printed circuit board.

18. The process of claim 17 further comprising:
   mounting an additional mechanical oscillation damping structure to the heat sink.

19. The process of claim 16 further comprising:
   drop testing the board-level package by applying a half-sine mechanical shock to the board-level package.

20. The process of claim 19 in which the drop testing further comprises:
   testing one or more electrical connections between the die package and the circuit board for failure.

\* \* \* \* \*